US006809423B1

(12) United States Patent
Mithal et al.

(10) Patent No.: US 6,809,423 B1
(45) Date of Patent: Oct. 26, 2004

(54) ELECTRONIC MODULE

(75) Inventors: Pankaj Mithal, Kokomo, IN (US); Bradley R. Knigga, Russiaville, IN (US); Steven A. Middleton, Cicero, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/717,245

(22) Filed: Nov. 19, 2003

(51) Int. Cl.[7] .......................... H01L 23/48; H01L 23/22
(52) U.S. Cl. .................. 257/778; 257/687; 257/697; 257/795
(58) Field of Search ................ 257/633, 685–687, 257/692, 694, 697, 701, 702, 704, 706, 707, 717, 777, 778, 780, 787, 788, 795; 438/108, 109, 112, 124–127

(56) References Cited

U.S. PATENT DOCUMENTS

| 5,220,200 A | * | 6/1993 | Blanton | 257/778 |
| 6,459,144 B1 | * | 10/2002 | Pu et al. | 257/667 |
| 6,570,259 B2 | * | 5/2003 | Alcoe et al. | 257/778 |

* cited by examiner

*Primary Examiner*—Hung Vu
(74) *Attorney, Agent, or Firm*—Stefan V. Chmielewski

(57) ABSTRACT

An electronic module that includes a plurality of electrically conductive leads, an electrically conductive base plate, a first integrated circuit (IC) die, at least one material block and an electrically non-conductive overmold. The at least one material block functions to more closely match coefficient of thermal expansion (CTE) differences between components of the electronic module.

20 Claims, 2 Drawing Sheets

ELECTRONIC MODULE

TECHNICAL FIELD

The present invention is generally directed to a module and, more specifically, an electronic module.

BACKGROUND OF THE INVENTION

Electronic modules have been widely utilized in the automotive industry and may take various forms, such as an all silicon ignition (ASI) module implemented in a TO247 package, as is shown in FIG. 1.

FIG. 1 depicts an exemplary electronic module 100 constructed according to the prior art. The electronic module 100 includes an electrically conductive tab/header or base plate 102 that may act as a ground plane and be connected to one or more of a plurality of conductive lead pins 104. A silicon die 106 that includes circuitry to implement a transistor, such as an insulated gate bipolar transistor (IGBT), may be configured such that a drain of the transistor is brought out on a face of the die 106 coupled to the base plate 102. In this configuration, a gate and source of the transistor are brought out on a face of the die 106 opposite the drain. A substrate 108, such as an alumina substrate, may provide interconnecting paths for a plurality of electronic components, such as a chip capacitor 112 and an application specific integrated circuit (ASIC) 110, and may also provide bond pads 114 for coupling the various associated components of the substrate 108 to one or more of the lead pins 104 and/or to circuitry integrated within the die 106. In a typical such assembly, the electronic components are encased in an epoxy mold compound 116. The epoxy mold compound may serve to seal the electronic components from the environment and may also be utilized to better match a coefficient of thermal expansion (CTE) of the various components located within the assembly 100.

In spite of the standardized manufacturing processes utilized to assemble the electronic module 100, various components, such as a solder attachment point, wire bonds and the molding compound, have exhibited negative characteristics, e.g., solder joint cracking, wire bond failure and delamination, respectively. It should be appreciated that these failures may seriously compromise the robustness and long-term reliability of the module 100. At the very least, such failure causes severe performance degradation and may also result in complete field failures of the module 100.

With reference to FIG. 2, delamination areas 120A and 120B indicate where delamination failures have frequently occurred in the module 100. In general, the cause of the delamination failures in the areas 120A and 120B are the result of CTE mismatches between the various layers of the module 100. For example, a typical epoxy molding compound has a coefficient of thermal expansion between about 10 ppm/° C. and 13 ppm/° C., with copper having a CTE of approximately 17 ppm/° C. and a typical silicon die having a CTE of approximately 3 ppm/° C. It should be appreciated that the mismatch in the CTE between the various components induces thermal stress at the interface of the various layers of the module 100, when the module 100 is subjected to temperature excursions from its stress-free molding temperature.

The interface between the molding compound 116 and a top surface of the header 102 is subject to both tensile and shearing stresses, which can result in delamination at this interface when the resultant state of stress of the interface exceeds the adhesion strength of the molding compound 116 to the copper of the header 102.

With reference to FIG. 3, a diagram 300 shows the regions of the interface that are in tension (tension areas 304) and compression (compression areas 302). From various simulations, it is apparent that the likelihood of delamination is the greatest in the tension areas 304. It should also be appreciated that the tendency to delaminate is further exacerbated when the maximum shear stress exceeds the interfacial adhesion strength in shear. When the header 102 is plated with nickel, which has an extremely low adhesion strength (approximately 0 MPa) to a typical molding compound, the delamination problem is further exacerbated. Inherently low adhesion strength in the presence of shearing and tensile stresses at the interface between the header 102 and the molding compound 116 increases the likelihood that the molding compound 116 will delaminate from the header 102 and, in fact, it has been a persistent problem with the design of the module 100.

Delamination of the molding compound 116 from the header 102 negates one of the primary purposes for which the molding compound 116 is used in the module 100. That is, the molding compound 116 has typically been selected such that its CTE is in between the CTE of the silicon die 106 and the header 102 to provide a buffer layer.

Utilizing a molding compound 116 that has a CTE value between that of the silicon die 106 and the header 102 generally causes the silicon die 106 to contract more than it would if it was free-standing and causes the header 102 to contract less than it would if it was free-standing. In other words, the CTE mismatch between the silicon die 106 and the header 102 is reduced by the molding compound 116. Reduction of the CTE mismatch between the silicon die 106 and the header 102 results in solder joints between the two devices, experiencing a lower shear stress and, as such, showing an improved resistance to fatigue-induced cracking. However, when the molding compound 116 delaminates from either the silicon die 106 or the header 102 (or both), it no longer provides an effective buffer. At least one approach to addressing this problem has been to apply a coating of a polyimide material onto the header 102 and the other components mounted to the header 102 prior to encapsulation with the molding compound 116. In such an embodiment, the polyimide material acts as an adhesion promoter and increases the adhesion strength of the molding compound 116 to the header 102. However, the addition of polyimide to the design generally results in increased cost and, at times, can be difficult to apply in a consistent manner such that coverages of the areas where no delamination is acceptable are adequately covered.

What is needed is an electronic module that exhibits reduced delamination problems.

SUMMARY OF THE INVENTION

One embodiment of the present invention is directed to an electronic module that includes a plurality of electrically conductive lead pins, an electrically conductive base plate, a first integrated circuit (IC) die, at least one material block and an electrically non-conductive overmold. The first IC die is attached to the base plate and is electrically coupled to one or more of the lead pins. The at least one material block is positioned adjacent the die and attached to the base plate. The material block has a coefficient of thermal expansion (CTE) that is greater than the CTE of the die and less than the CTE of the base plate. The electrically non-conductive overmold encapsulates the die, the material block, the base plate and a portion of the lead pins.

According to another embodiment of the present invention, the overmold is an epoxy molding compound.

According to still other embodiments of the present invention, the base plate is made of a nickel-plated copper and the material block is made of alumina. In at least one embodiment, the material block is rectangular and has about the same thickness as the die. In another embodiment, the material block is attached to the base plate with solder. In yet another embodiment, the material block has a CTE of about 7 parts per million per degrees Celsius (ppm/° C.), the base plate has a CTE of about 17 ppm/° C. and the die has a CTE of about 3 ppm/° C., with the overmold having a CTE in the range of 10 ppm/° C. to about 13 ppm/° C.

In still another embodiment, the module includes a substrate having a plurality of conductive traces and a plurality of electronic components electrically coupled to the substrate. The substrate is attached to the base plate and the electronic components include at least a second IC die that is electrically coupled to at least a portion of the conductive traces of the substrate and the first IC die.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to the present invention, an electronic module is described herein that exhibits superior thermal characteristics to those currently available. A module designed according to the present invention exhibits reduced maximum shear stress that is experienced by solder joints between a die and a header and exhibits reduced risk of delamination of the epoxy molding compound from the header. According to one embodiment of the present invention, three rectangular blocks of alumina are attached to the header in close proximity to the silicon die (see FIG. 4).

Figure 1:
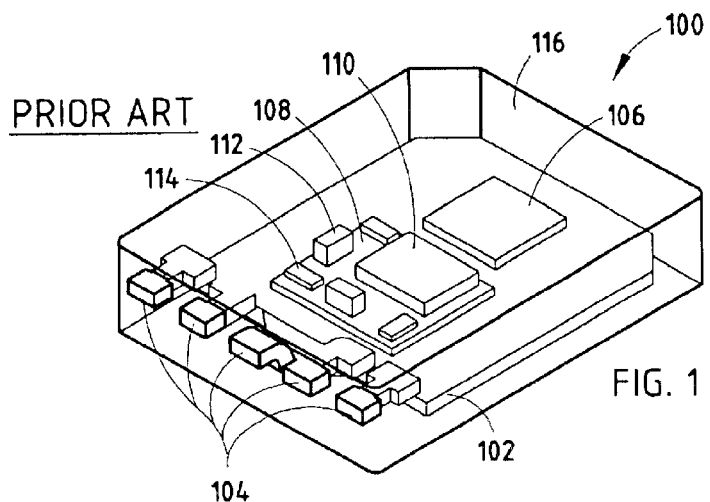
FIG. 1 is a perspective view of an exemplary electronic module according to the prior art.
Figure 2:
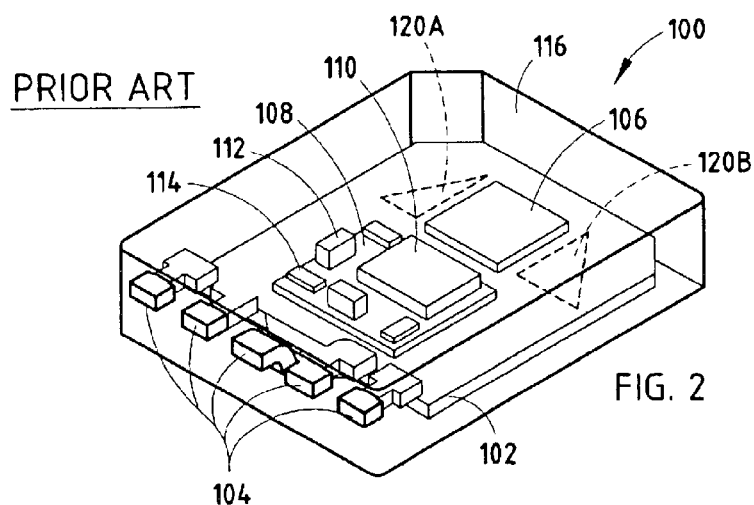
FIG. 2 is a perspective view of the module of FIG. 1 illustrating points where delamination and cracked solder joints typically occur.
Figure 3:
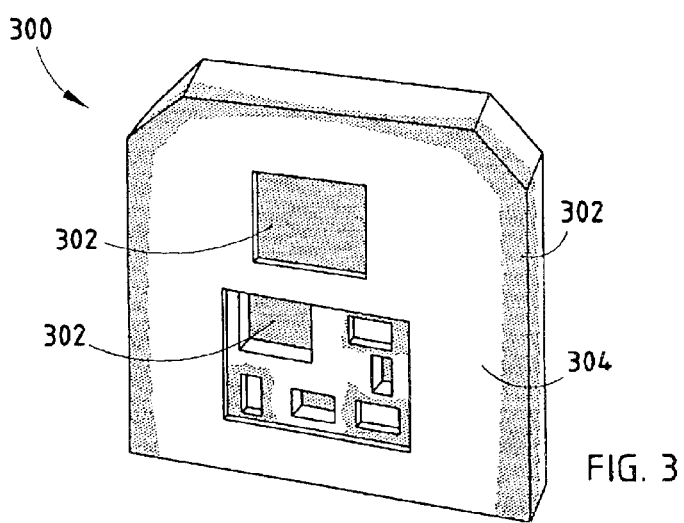
FIG. 3 is a diagram of a typical module according to the prior art indicating portions of the module that are in tension and compression.
Figure 4:
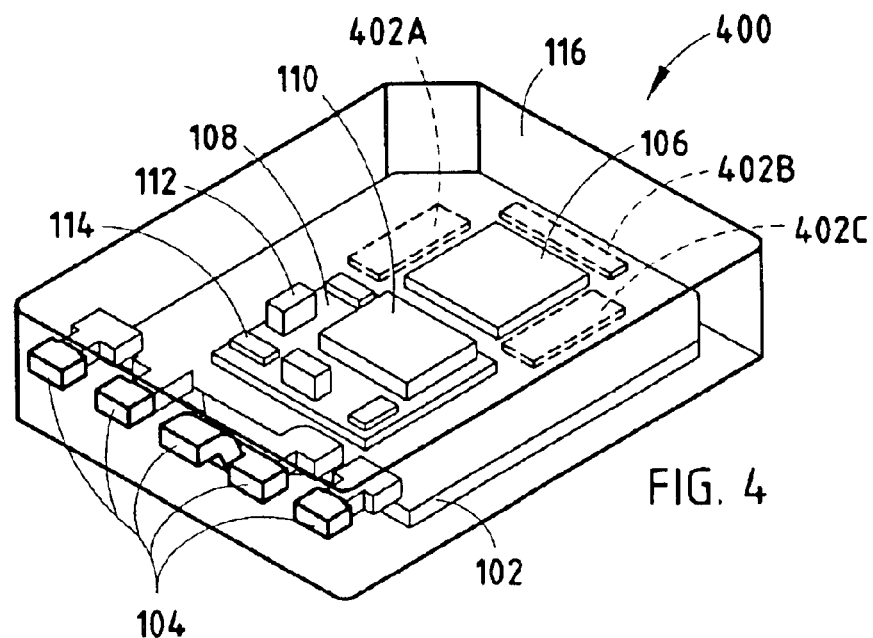
FIG. 4 is a perspective view of an electronic module constructed according to one embodiment of the present invention.

With reference to FIG. 4, an electronic module 400 includes three rectangular material, e.g., alumina, blocks 402A, 402B and 402C, which surround a silicon die 106. The blocks 402A–402C may be approximately the same thickness as the die 106. However, it should be appreciated that an exact shape, size and placement of material used in the blocks 402A–402C. may be optimized, depending upon the application in which they are implemented. The blocks 402A–402C may be soldered or glued to a surface of the header 102, with the same solder or adhesive that is used for attaching the die 106 to the header 102 or attaching the substrate 108 to the header 102. It should also be appreciated that the attachment of the blocks 402A–402C to the header 102 can be combined with a soldering operation that is used to attach the die 106 to the header 102. Alternatively, the blocks 402A–402C can be attached to the header 102 in the same process step that is used to attach the substrate 108 to the header 102. In one embodiment, the blocks 402A–402C have a CTE of about 7 ppm/° C., which tends to improve the reliability of the design by locally reducing the effective CTE of the header 102, which decreases the CTE mismatch between the die 106 and the header 102. In this manner, the blocks 402A–402C essentially perform at least one function of the molding compound, i.e., matching the CTE between the die 106 and the header 102, while significantly reducing the risk of delamination of the molding compound 116 from the header 102.

Figure 5:
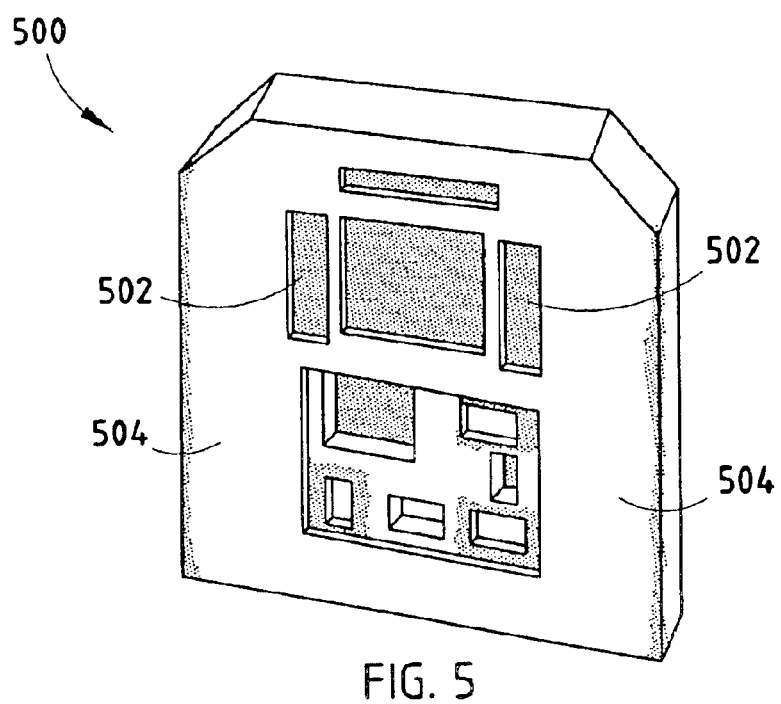
FIG. 5 is a diagram of the module of FIG. 4 illustrating areas of the module that are in compression and tension.

With reference to FIG. 5, a diagram 500 illustrates the regions of the interface that are in tension (tension areas 504) with those that are in compression (compression areas 502). As shown, the interface between the molding compound 116 and the blocks 402A–402C are in compression. This indicates that the blocks 402A–402C serve as mold locks, which tend to counter any tendency of the molding compound 116 to peel away from the header 102. Additionally, the total normal force acting on the molding compound 116 and header 102 interface is reduced as a larger percentage of the interface is in compression relative to the previous designs.

Simulations have shown that the maximum shear stress in the solder joint between the die 106 and the header 102 in the design described herein are approximately 7 percent lower when compared to prior art designs. It should be appreciated that reducing the maximum shear stress in the solder joint that couples the die 106 to the header 102 is advantageous as it has a direct bearing on reducing the possibility of fatigue-induced cracks in the solder joint. That is, the reduction of shear stress on a solder joint leads to increased reliability of that solder joint. Further, preventing or reducing fatigue cracking of a solder joint is important from a thermal management perspective, as excessive cracking of a solder joint can cause an unacceptable increase in the thermal resistance of the die 106/header 102 stack, leading to severe degradation in the electrical performance of the system in which the module 100 is implemented.

Accordingly, an electronic module has been described herein that is particularly advantageous when implemented within the automotive environment, which may subject such modules to extreme environmental conditions. Further, modules constructed according to the present invention generally allow for the elimination of processes and materials that are currently employed in the assembly of currently available electronic modules.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. An electronic module, comprising:

a plurality of electrically conductive lead pins;

an electrically conductive base plate;

a first integrated circuit (IC) die attached to the base plate, wherein the IC die is electrically coupled to one or more of the lead pins;

at least one material block positioned adjacent the die and attached to the base plate, wherein the material block has a coefficient of thermal expansion (CTE) that is greater than a CTE of the die and less than a CTE of the base plate; and an electrically non-conductive overmold encapsulating the die, the material block, the base plate and a portion of the lead pins.

2. The module of claim 1, wherein the overmold is an epoxy molding compound.

3. The module of claim 1, wherein the base plate is made of nickel-plated copper.

4. The module of claim 1, wherein the material block is made of alumina.

5. The module of claim 4, wherein the material block is attached to the base plate with solder.

6. The module of claim 1, wherein the material block is rectangular and has about the same thickness as the die.

7. The module of claim 1, wherein the material block has a CTE of about 7 ppm/° C., the base plate has a CTE of about 17 ppm/° C. and the die has a CTE of about 3 ppm/° C. and the overmold has a CTE in a range from about 10 ppm/° C. to about 13 ppm/° C.

8. The module of claim 1, wherein the material block is attached to the base plate with solder.

9. The module of claim 1, further comprising:

a substrate including a plurality of conductive traces, wherein the substrate is attached to the base plate; and a plurality of electronic components electrically coupled to the substrate, the electronic components including at least a second IC die, wherein the second IC die is electrically coupled to at least a portion of the conductive traces of the substrate and the first IC die.

10. The module of claim 1, wherein the base plate acts as a ground plane, and wherein the base plate is electrically coupled to at least one of the lead pins.

11. An electronic module, comprising:

a plurality of electrically conductive lead pins;

an electrically conductive base plate;

a first integrated circuit (IC) die attached to the base plate, wherein the IC die is electrically coupled to one or more of the lead pins;

at least one material block positioned adjacent the die and attached to the base plate, wherein the material block has a coefficient of thermal expansion (CTE) that is greater than a CTE of the die and less than a CTE of the base plate;

an electrically non-conductive overmold encapsulating the die, the material block, the base plate and a portion of the lead pins;

a substrate including a plurality of conductive traces, wherein the substrate is attached to the base plate; and a plurality of electronic components electrically coupled to the substrate, the electronic components including at least a second IC die, wherein the second IC die is electrically coupled to at least a portion of the conductive traces of the substrate and the first IC die.

12. The module of claim 11, wherein the overmold is an epoxy molding compound.

13. The module of claim 11, wherein the base plate is made of nickel-plated copper.

14. The module of claim 11, wherein the material block is made of alumina.

15. The module of claim 11, wherein the material block is rectangular and has about the same thickness as the die.

16. The module of claim 15, wherein the material block is attached to the base plate with solder.

17. The module of claim 11, wherein the material block has a CTE of about 7 ppm/° C., the base plate has a CTE of about 17 ppm/° C. and the die has a CTE of about 3 ppm/° C. and the overmold has a CTE in a range from about 10 ppm/° C. to about 13 ppm/° C.

18. The module of claim 11, wherein the material block is attached to the base plate with solder.

19. The module of claim 11, wherein the base plate acts acts a ground plane, and wherein the base plate is electrically coupled to at least one of the lead pins.

20. An electronic module, comprising:

a plurality of electrically conductive lead pins;

an electrically conductive base plate;

a first integrated circuit (IC) die attached to the base plate, wherein the IC die is electrically coupled to one or more of the lead pins;

at least one material block positioned adjacent the die and attached to the base plate, wherein the material block has a coefficient of thermal expansion (CTE) that is greater than a CTE of the die and less than a CTE of the base plate;

an electrically non-conductive overmold encapsulating the die the material block, the base plate and a portion of the lead pins;

a substrate including a plurality of conductive traces, wherein the substrate is attached to the base plate; and a plurality of electronic components electrically coupled to the substrate, the electronic components including at least a second IC die, wherein the second IC die is electrically coupled to at least a portion of the conductive traces of the substrate and the first IC die; and wherein the material block is made of alumina.

* * * * *